(12) United States Patent
Li

(10) Patent No.: US 9,224,762 B1
(45) Date of Patent: Dec. 29, 2015

(54) ARRAY SUBSTRATE AND DISPLAY DEVICE

(71) Applicants: Boe Technology Group Co., Ltd., Beijing (CN); Chengdu Boe Optoelectronics Technology Co., Ltd., Chengdu (CN)

(72) Inventor: Kun Li, Beijing (CN)

(73) Assignees: Boe Technology Group Co., Ltd., Beijing (CN); Chengdu Boe Optoelectronics Technology Co., Ltd., Chengdu (CN)

( * ) Notice: Subject to any disclaimer, the term of this patent is extended or adjusted under 35 U.S.C. 154(b) by 0 days.

(21) Appl. No.: 14/500,464

(22) Filed: Sep. 29, 2014

(30) Foreign Application Priority Data

Jun. 25, 2014 (CN) .......................... 2014 1 0289704

(51) Int. Cl.
| | | |
|---|---|---|
| H01L 29/04 | (2006.01) | |
| H01L 27/14 | (2006.01) | |
| H01L 23/62 | (2006.01) | |
| H01L 21/70 | (2006.01) | |
| H01L 27/12 | (2006.01) | |
| H01L 29/49 | (2006.01) | |
| H01L 29/423 | (2006.01) | |

(52) U.S. Cl.
CPC ........ *H01L 27/1248* (2013.01); *H01L 27/1214* (2013.01); *H01L 29/42384* (2013.01); *H01L 29/4908* (2013.01)

(58) Field of Classification Search
CPC ..................... H01L 29/42384; H01L 27/1214; H01L 27/1255; H01L 29/4908; H01L 31/022466

USPC ................ 257/59, 72, 347, 359, 390, E21.04, 257/E21.409, E21.414

See application file for complete search history.

(56) References Cited

U.S. PATENT DOCUMENTS

| | | | |
|---|---|---|---|
| 2012/0050643 A1* | 3/2012 | Li ........................... | H01L 27/12 349/61 |
| 2014/0054581 A1* | 2/2014 | Song ..................... | G02F 1/1343 257/43 |
| 2015/0260360 A1* | 9/2015 | Li ............................ | F21L 4/08 349/33 |

\* cited by examiner

*Primary Examiner* — Mohsen Ahmadi
(74) *Attorney, Agent, or Firm* — Calfee, Halter & Griswold LLP

(57) ABSTRACT

An array substrate and a display device incorporating the array substrate are disclosed. The array substrate comprises a first material layer located on a thin film transistor, the first material layer having a first via hole; a conductive interlayer located on the first material layer, the conductive interlayer being electrically connected with the drain of the thin film transistor through the first via hole; and a second material layer located on the conductive interlayer, the second material layer having a second via hole staggered with the first via hole. A pixel electrode is located on the second material layer. The conductive interlayer is electrically connected with the pixel electrode through the second via hole, so as to form a storage capacitance with a common electrode. The array substrate has an increased storage capacitance and provides the display device with improved display stability, pixel opening ratio, and display quality.

15 Claims, 12 Drawing Sheets

ARRAY SUBSTRATE AND DISPLAY DEVICE

RELATED APPLICATIONS

The present application claims the benefit of Chinese Patent Application No. 201410289704.5, filed Jun. 25, 2014, the entire disclosure of which is incorporated herein by reference.

FIELD

The present disclosure relates to the field of display technology, and particularly to an array substrate and a display device incorporating same.

BACKGROUND

The COA (Color-filter on Array) technology is an integration technology that fabricates a color filter layer on an array substrate directly, which can effectively avoid the problem of light leakage of a liquid crystal display device in a box-aligning process due to an alignment deviation, and can also improve the display opening ratio significantly.

The structure of a conventional array substrate of the COA technology is shown in FIG. 1, wherein the structure comprises a substrate 101, a gate line layer (including a gate line, a gate 102, and a common electrode), a gate insulating layer 103, a semiconductor layer 104, a data line layer (including a data line, a source 105, and a drain 106), an insulating layer 107, a color filter layer 108, a light shielding layer 109, and a pixel electrode 110. The material of the color filter layer 108 is a color photoresist. A common electrode (not shown) is located under the color filter layer 108 and is opposite to the pixel electrode 110 so as to form a storage capacitance. The pixel electrode 110 is electrically connected with the drain 106 through a via hole.

The size of the capacitance is inversely proportional to the spacing between two polar plates that form the capacitance, and the color filter layer 108 generally requires a relatively great thickness. Therefore, in the prior art, the spacing between the pixel electrode 110 and the common electrode of the array substrate integrated with the color filter layer 108 is relatively large, which results in a relatively low storage capacitance that cannot meet the requirement of leakage current in the display cycle. Consequently, the display stability is reduced.

Moreover, since the via hole for electrically connecting the pixel electrode 110 and the drain 106 needs to pass through the thick color filter layer 108, the depth of the via hole is extremely large, such that it is difficult to control the shape of the via hole, and it is easy to result in an excessive aperture ratio of the via hole, thereby causing the opening ratio of the pixel to be reduced. Additionally, if the gradient angle of the inner wall of the relatively deep via hole is too abrupt, breakage of the pixel electrode 110 carried thereon may result, thereby reducing the display quality.

SUMMARY

The present disclosure provides an array substrate adopting the COA technology and a display device incorporating the array substrate. The array substrate and the associated display device may provide one or more of an improved display stability, opening ratio, and display quality.

In an exemplary aspect of the present disclosure, an array substrate comprises a thin film transistor, a pixel electrode, and a common electrode, wherein the array substrate further comprises: a first material layer located on the thin film transistor, the first material layer having a first via hole; a conductive interlayer located on the first material layer, the conductive interlayer being electrically connected with the drain of the thin film transistor through the first via hole; and a second material layer located on the conductive interlayer, the second material layer having a second via hole staggered with the first via hole, the pixel electrode being located on the second material layer, the conductive interlayer being electrically connected with the pixel electrode through the second via hole, so as to form a storage capacitance with the common electrode; wherein the material of a part of the first material layer located within the opening area of the array substrate and the material of a part of the second material layer located within the opening area of the array substrate are both color photoresists.

Preferably, the material of the conductive interlayer is a transparent conductive material.

Preferably, but not necessarily, the second via hole is located in a part of the second material layer that corresponds to one of the thin film transistor and the common electrode.

Preferably, but not necessarily, the material of a part of the first material layer that covers the thin film transistor and/or the material of a part of the second material layer that covers the thin film transistor are light shielding materials.

Preferably, but not necessarily, the material of a part of the first material layer that covers the common electrode and/or the material of a part of the second material layer that covers the common electrode are light shielding materials.

In another exemplary aspect of the present disclosure, an array substrate comprises a thin film transistor, a pixel electrode, and an element for providing a common electrode voltage, wherein the array substrate further comprises: a first material layer located on the thin film transistor, the first material layer having a first via hole; a first conductive interlayer and a second conductive interlayer located on the first material layer, the first conductive interlayer and the second conductive interlayer being insulated with each other, the first conductive interlayer being electrically connected with the drain of the thin film transistor through the first via hole, and the second conductive interlayer being electrically connected with the element for providing a common electrode voltage; and a second material layer located on the first conductive interlayer and the second conductive interlayer, the second material layer having a second via hole staggered with the first via hole, and the pixel electrode being located on the second material layer; wherein the first conductive interlayer is electrically connected with the pixel electrode through the second via hole, so as to enable the pixel electrode to form a storage capacitance with the second conductive interlayer, or the second conductive interlayer is electrically connected with the pixel electrode through the second via hole, so as to enable the pixel electrode to form a storage capacitance with the first conductive interlayer; and wherein the material of a part of the first material layer located within the opening area of the array substrate and the material of a part of the second material layer located within the opening area are both color photoresists.

Preferably, but not necessarily, the pixel electrode is one of a whole piece of thin film and a plurality of strip electrodes located side by side.

Preferably, but not necessarily, the first material layer further has a third via hole, the second conductive interlayer being electrically connected with the element for providing a common electrode voltage through the third via hole.

Preferably, but not necessarily, the element for providing a common electrode voltage is a common electrode, and the third via hole is located in a part of the first material layer that corresponds to the common electrode.

Preferably, but not necessarily, the second via hole is located in a part of the second material layer that corresponds to the common electrode when the second conductive interlayer is electrically connected with the pixel electrode through the second via hole.

Preferably, but not necessarily, the material of a part of the first material layer that covers the common electrode and/or the material of a part of the second material layer that covers the common electrode are light shielding materials.

Preferably, but not necessarily, the element for providing a common electrode voltage is a peripheral signal line of the array substrate, and the third via hole is located in a part of the first material layer that corresponds to the peripheral signal line.

Preferably, but not necessarily, the element for providing a common electrode voltage is formed in the same layer as the gate of the thin film transistor, and the depth of the third via hole is greater than the thickness of the first material layer.

Preferably, but not necessarily, the element for providing a common electrode voltage comprises: a first part formed in the same layer as the gate of the thin film transistor, and a second part formed in the same layer as the source and the drain of the thin film transistor, wherein the depth of the third via hole is less than the thickness of the first material layer.

Preferably, but not necessarily, the materials of the first conductive interlayer and the second conductive interlayer are transparent conductive materials.

Preferably, but not necessarily, the second via hole is located in a part of the second material layer that corresponds to the thin film transistor when the first conductive interlayer is electrically connected with the pixel electrode through the second via hole.

Preferably, but not necessarily, the material of a part of the first material layer that covers the thin film transistor and/or the material of a part of the second material layer that covers the thin film transistor are light shielding materials.

The present disclosure further provides a display device comprising an array substrate as described above.

In the array substrate and the display device incorporate same, the color filter layer is divided into two layers (a first material layer and a second material layer), conductive interlayers are formed between these two layers, staggered via holes are formed in the two layers respectively, and the conductive interlayers are electrically connected with electrodes (a pixel electrode and a common electrode) that form a storage capacitance through the via holes, thereby enabling the conductive interlayers to become electrodes that form the storage capacitance.

Since the conductive interlayers are located in the middle of the color filter layer, the distance between two polar plates that form the storage capacitance is reduced relative to the prior art, such that the storage capacitance is increased. Accordingly, the conductive interlayers allow the array substrate to meet the requirement of leakage current in the display cycle, and improve the display stability. Moreover, the via hole for electrical connection according to the present disclosure is located in the first material layer and the second material layer, compared with the via hole that penetrates the whole color filter layer according to the prior art. Since two via holes with relatively small depth are provided, the aperture ratio of the via holes will not be too large, which improves the pixel opening ratio. Furthermore, the pixel electrode carried on the via hole is not easily broken, thereby improving the display quality of the device picture.

BRIEF DESCRIPTION OF DRAWINGS

Several technical aspects of the present disclosure will be described in more detail below with reference to the accompanying drawings in order for those skilled in the art to be able to carry out the present disclosure. The present disclosure may, however, be embodied in many different forms and should not be construed as limited to the exemplary embodiments set forth herein. In particular, the general inventive concepts are not intended to be limited by the various illustrative embodiments disclosed herein.

DETAILED DESCRIPTION

Figure 1:
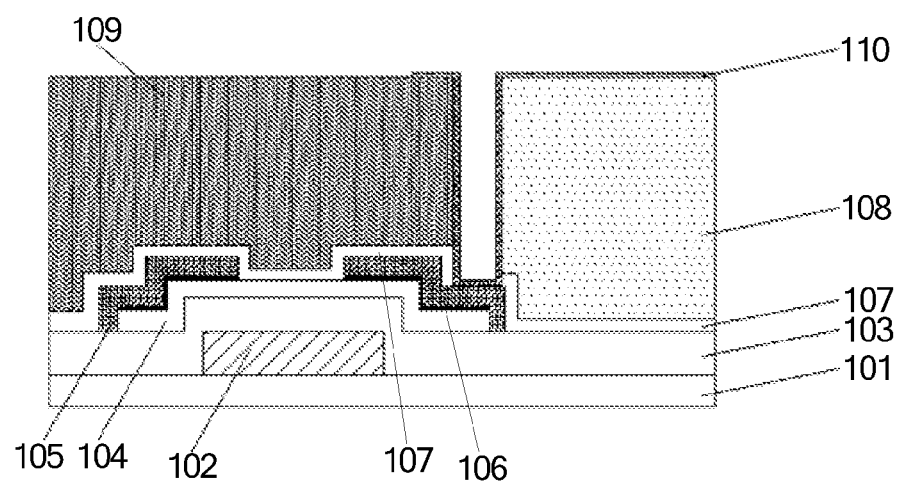
FIG. 1 is a structural view of a conventional array substrate using the COA technology.

The present invention and associated general inventive concepts will be further described hereinafter in detail with reference to the accompanying drawings and various exemplary embodiments. One of ordinary skill in the art will appreciate that these exemplary embodiments only constitute some of the possible embodiments encompassed by the present invention and associated general inventive concepts. As such, the scope of the present disclosure is by no means limited to the exemplary embodiments set forth herein.

In a first exemplary embodiment, an array substrate comprises a thin film transistor, a pixel electrode, and a common electrode. The array substrate further comprises: a first material layer located on the thin film transistor, the first material layer having a first via hole; a conductive interlayer located on the first material layer, the conductive interlayer being electrically connected with the drain of the thin film transistor through the first via hole; and a second material layer located on the conductive interlayer, the second material layer having a second via hole staggered with the first via hole, the pixel electrode being located on the second material layer, and the conductive interlayer being electrically connected with the pixel electrode through the second via hole, so as to form a storage capacitance with the common electrode; wherein the material of a part of the first material layer located within the opening area of the array substrate and the material of a part of the second material layer located within the opening area are both color photoresists.

In this exemplary array substrate, the first material layer and the second material layer located in the opening area thereof are both formed by color photoresists. As compared with the conventional color filter layer, the color filter layer according to the present disclosure is divided into a first material layer and a second material layer. By forming a first via hole and a second via hole in the first material layer and the second material layer, respectively, a conductive interlayer is inserted between the first material layer and the second material layer. The conductive interlayer is connected with the drain through the first via hole and connected with the pixel electrode through the second via hole. The conductive interlayer has the same electric potential as the pixel electrode at the same time of realizing electric connection of the pixel electrode and the drain, so as to form a storage capacitance between the conductive interlayer and the common electrode.

The storage capacitance of the conventional array substrate is formed by a pixel electrode located above and a common electrode located under the color filter layer. Conversely, in the first exemplary embodiment, since the conductive interlayer is located between the first material layer and the second material layer that constitute the color filter layer, the distance between two polar plates of the storage capacitance of the array substrate in this first exemplary embodiment is less than the distance between two polar plates of the storage capacitance of the conventional array substrate. As a result, the storage capacitance of the array substrate is increased, such that the leakage current for maintaining picture display of the previous frame in the picture switching process is increased, and the stability of the display is improved.

Moreover, in the array substrate according to the first exemplary embodiment, the first via hole for connecting the pixel electrode and the drain penetrates the first material layer, the second via hole penetrates the second material layer, and the depths of the two via holes are both less than the depth of the via hole that penetrates the whole color filter layer in the prior art. According to the present disclosure, the reduced depth of the via hole makes it easier to control the shape of the via hole in the via hole forming process. Accordingly, the aperture ratio of the first via hole and the second via hole can be made smaller, which is favorable for reducing the opening ratio. Furthermore, the gradient angle of the inner wall of a via hole with a reduced depth will not be as abrupt, which enables the pixel electrode that covers the inner wall of the via hole to be tougher and less prone to breaking, thereby improving the display quality.

Figure 3:
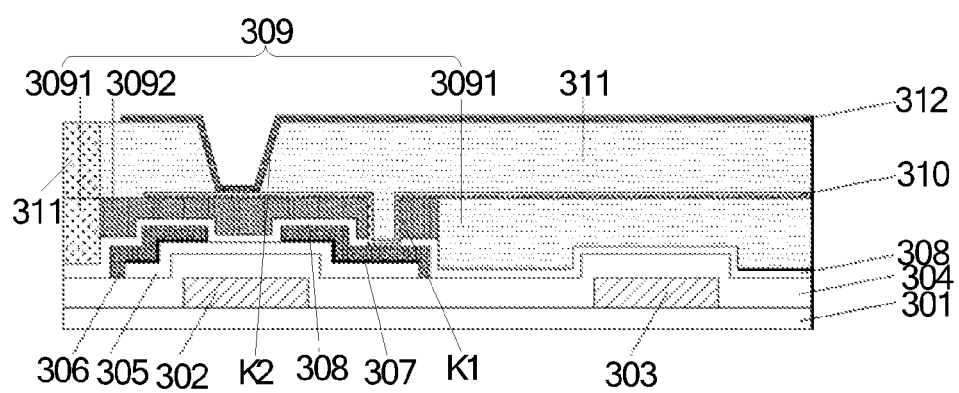
FIG. 3 is a structural view of a first array substrate, according to a first exemplary embodiment.

As shown in FIG. 3, an exemplary array substrate, according to the first exemplary embodiment, comprises a substrate 301; a gate line layer located on the substrate 301, the gate line layer comprising a gate line, a gate 302, and a common electrode 303, the gate 302 being electrically connected with the gate line; a gate insulating layer 304 that covers the gate line layer; a semiconductor layer 305 located on the gate insulating layer 304; a data line layer located on the semiconductor layer, wherein the gate 302, the gate insulating layer 304, the semiconductor layer 305, a source 306, and a drain 307 constitute a TFT (Thin Film Transistor); an insulating layer 308 that covers the data line layer; a first material layer 309 that covers the insulating layer 308, the first material layer 309 comprising a first color filter layer 3091 located in the pixel opening area and a first light shielding layer 3092 that covers the TFT, the first light shielding layer 3092 having a first via hole K1; a conductive interlayer 310 that covers the first material layer 309, the conductive interlayer 310 being electrically connected with the drain 307 through the first via hole K1; a second material layer 311 that covers the conductive interlayer 310, the second material layer 311 having a second via hole K2; and a pixel electrode 312 that covers the second material layer 311, the pixel electrode 312 being electrically connected with the conductive interlayer 310 through the second via hole K2.

While the TFT shown in FIG. 3 is a bottom gate structure, in other exemplary embodiments, the TFT of the array substrate may be a top gate structure or a side gate structure.

In an exemplary embodiment, the common electrode 303 is formed simultaneously with the gate line and the gate 302.

The function of the insulating layer 308 is to enable the data line layer to be insulated from the film formed on the data line layer. When the forming material of the first material layer 309 is an insulation material, the insulating layer 308 can be omitted.

Figure 4:
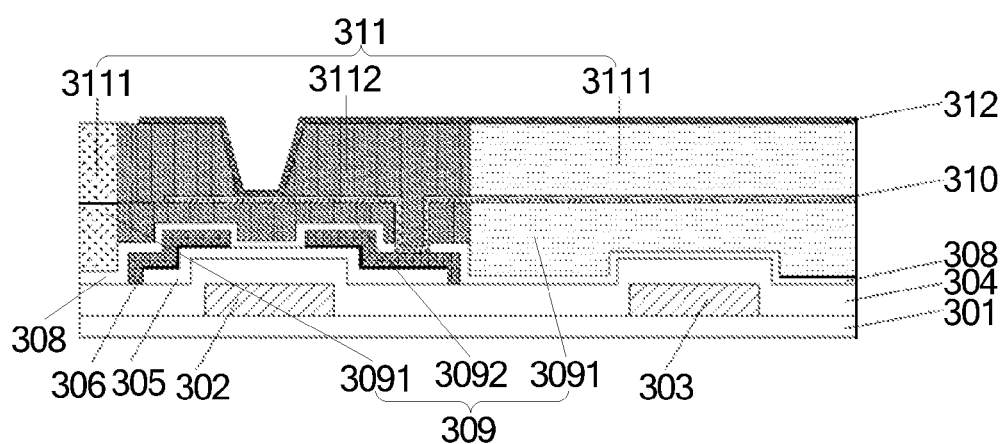
FIG. 4 is a structural view of a second array substrate, according to the first exemplary embodiment.

The forming material of the first light shielding layer 3092 may be light shielding materials such as metal material, inorganic material, organic material, etc., for shielding the TFT and reducing leakage of the TFT. In other exemplary embodiments, the light shielding layer for shielding the TFT may also be formed in the second material layer 311, or formed in the first material layer 309 and the second material layer 311. As shown in FIG. 4, the second material layer 311 comprises a second light shielding layer 3112 that covers the TFT; that is to say, the material of a part of the first material layer 309 that covers the TFT and/or the material of a part of the second material layer 311 that covers the TFT are preferably, but not necessarily, light shielding materials. In addition, in the first exemplary embodiment, light shielding layers may also be arranged in the first material 309 and/or the second material layer 311 above other elements (e.g., the common electrode 303) in the array substrate that need shielding. For example, the material of a part of the first material layer 309 that covers the common electrode 303 and/or the material of a part of the second material layer 311 that covers the common electrode 303 can be light shielding materials.

In an exemplary embodiment, the forming material of the first color filter layer 3091 is a color photoresist. A photoresist including the three colors of red, green, and blue can be used for enabling the light passing through the pixel opening area to have corresponding colors. Preferably, but not necessarily, the upper surface of the first color filter layer 3091 is aligned with the upper surface of the first light shielding layer 3092. The first exemplary embodiment does not define the thickness of the first color filter layer 3091. In actual production, the thickness can be determined based on the depth of the subsequently formed first via hole K1. Furthermore, the thickness of the first color filter layer 3091 can be approximately half of the thickness needed by the color filter layer formed in the opening area.

The first via hole K1 is preferably, but not necessarily, located at a position in the first light shielding layer 3092 of the first material layer 309 that corresponds to the drain for exposing the surface of the drain. The depth of the first via hole K1 may be designed based on factors such as the ability for controlling the shape of the via hole in the actual process of preparing the via hole, a toughness of the film that subsequently covers the inner wall of the via hole, etc.

The material of the conductive interlayer 310 is preferably, but not necessarily, a transparent conductive material, such as ITO (indium tin oxide), IZO (indium zinc oxide), etc. Besides covering the inner wall of the first via hole K1, the conductive interlayer 310 also needs to extend to the opening area of the pixel and above the common electrode 303 for obtaining the potential of the pixel electrode 312, and forming a storage capacitance with the common electrode 303 as a polar plate of the storage capacitance, so as to reduce the distance between the polar plate that has the potential of the pixel electrode and the polar plate (i.e., the common electrode 303) that has the potential of the common electrode in the storage capacitance, and increase the storage capacitance value.

In an exemplary embodiment, the forming material of the second material layer 311 mainly comprises color photoresist located in the pixel opening area, and constitutes, together with the first material layer 309, a color filter layer of the array substrate using the COA technology. The thickness of the second material layer 311 can be determined based on the depth of the second via hole K2 that is subsequently formed therein. Given the overall thickness of the color filter layer actually needed by the array substrate and the thickness of the first material layer 309, the thickness of the second material layer 311 can be approximately half of the overall thickness of the color filter layer actually needed by the array substrate. In an exemplary embodiment, the part of the second material layer 311, which corresponds to those elements (such as the TFT, the gate line, the data line, the common electrode 303, etc.) on the array substrate that need shielding, can be formed by using light shielding material. However, if the first material layer 309 in the area that needs shielding has been formed by using light shielding material, the second material layer 311 in this area can either be formed by using the light shielding material or be formed by not using the light shielding material. For example, referring to FIG. 4, the second material layer 311 may comprise a second color filter layer 3111 within the pixel opening area and a second light shielding layer 3112 that covers the TFT, so as to shield the TFT better.

The second via hole K2 is preferably, but not necessarily, located in a part of the second material layer 311 that covers the TFT originally, i.e., a position corresponding to the TFT. In an exemplary embodiment, the second via hole K2 is located at a portion above the channel of the TFT and close to the first via hole K1, so as to avoid influence to the pixel opening ratio. In an exemplary embodiment, the second via hole K2 is located in a part of the second material layer 311 that corresponds to the common electrode 303. The second via hole K2 is used for exposing the surface of the conductive interlayer 310, so as to enable the subsequently formed pixel electrode 312 to be electrically connected with the drain 307 through the conductive interlayer 310.

The pixel electrode 312 is preferably, but not necessarily, a whole piece of thin film, which has a different potential from the common electrode 303, so as to form a storage capacitance with the common electrode 303.

The array substrate using the COA technology, according to the first exemplary embodiment, has two material layers that are relatively thin and mainly formed by color photoresists. Thus, as compared with the conventional relatively thick color filter layer, the color filter layer in this exemplary embodiment is divided into two relatively thin color filter layers, and the conductive interlayer 310 having a pixel electrode potential is located between the two material layers, and forms a storage capacitance with the common electrode 303. In this manner, the distance between two polar plates that form the storage capacitance is shortened, the storage capacitance is increased, and the display stability is improved. Meanwhile, the original via hole for connecting the pixel electrode 312 and the drain 307 is divided into two via holes (i.e., via holes K1 and K2), with each via hole having a reduced depth compared to the conventional via hole, making it easier to control the shape of the via holes, and reducing the aperture ratio of the via holes, thereby increasing the opening ratio. Furthermore, because the steep degree of the inner wall of the via hole is reduced, the pixel electrode 312 that covers the inner wall of the via hole is less likely to break, thereby promoting improved display quality.

Figure 5:
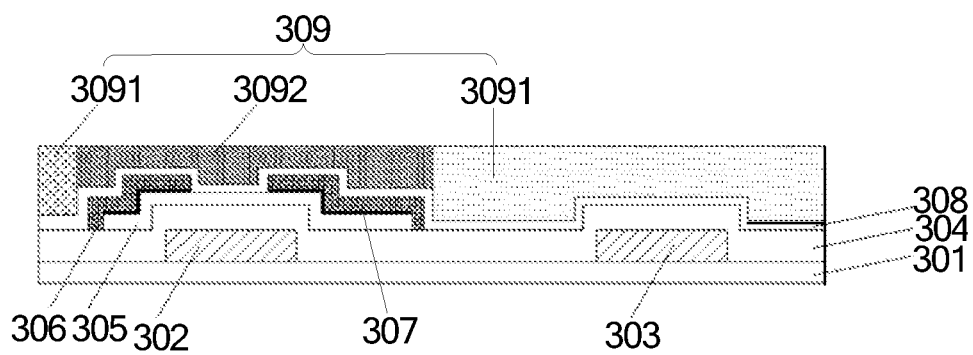
FIGS. 5-9 are fabricating step diagrams of the array substrate shown in FIG. 3.

Next, the fabricating process of the array substrate, according to the first exemplary embodiment, will be explained. Taking the array substrate shown in FIG. 3 as an example, the fabricating process of the array substrate may comprise the following steps:

Step S1: forming a first material layer 309 on an array substrate on which a TFT and a common electrode 303 are formed and that is covered by an insulating layer 308 using processes such as photoetching, ink jetting or dye doping, etc., as shown in FIG. 5.

Specifically, firstly forming a whole layer of first color filter layer 3091 on an array substrate on which the TFT and the common electrode 303 are formed using color photoresists. Then, removing the color photoresist in the area in which the first light shielding layer 3092 is to be formed using photoetching process. Subsequently, depositing the light shielding material using chemical vapor deposition process, and removing the light shielding material outside the area in which the first light shielding layer 3092 is to be formed using the photoetching process, forming a first light shielding layer 3092, and accomplishing fabrication of the first material layer 309.

Figure 6:
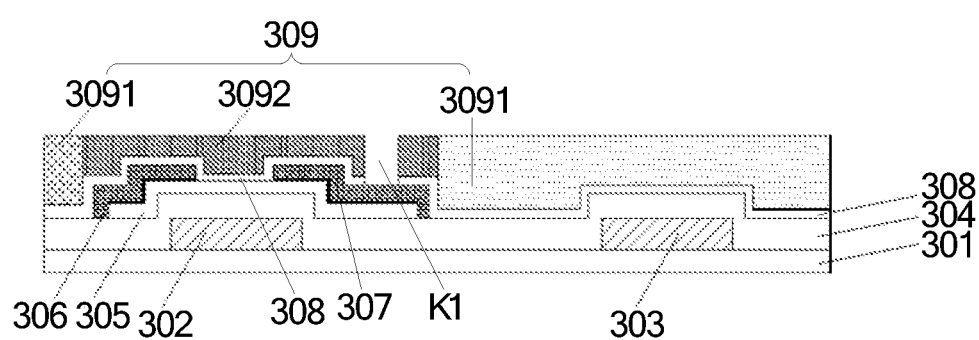

Step S2: forming a via hole K1 in the first material layer 309 using the photoetching process, as shown in FIG. 6.

Figure 7:
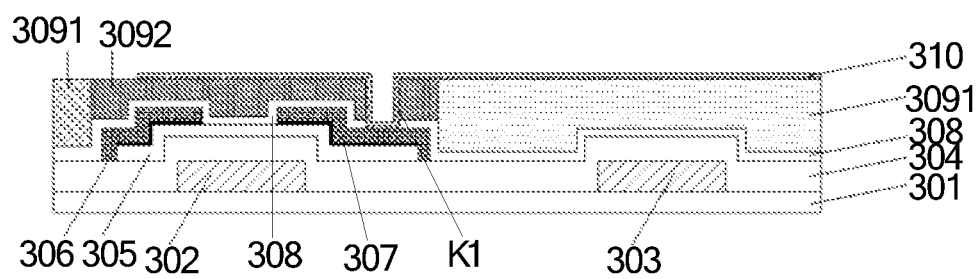

Step S3: forming a conductive interlayer 310 on the array substrate after the step S2 using processes such as chemical vapor deposition, a sputtering process, etc., as shown in FIG. 7.

Figure 8:
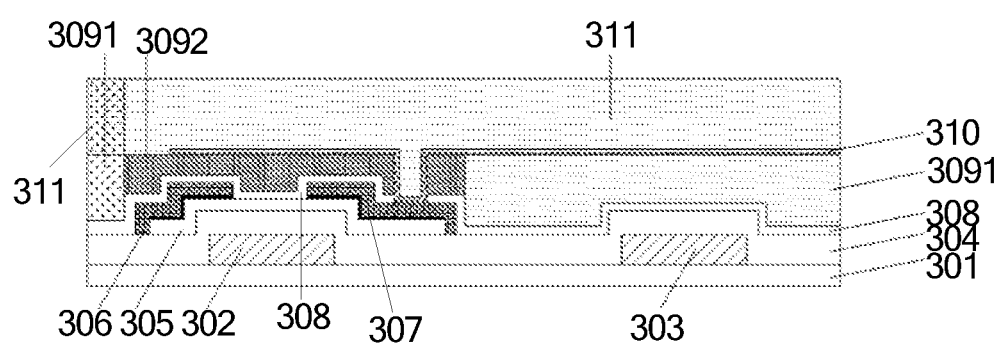

Step S4: forming a second material layer 311 on the array substrate after the step S3 using processes such as photoetching, ink jetting or dye doping, etc., as shown in FIG. 8.

Figure 9:
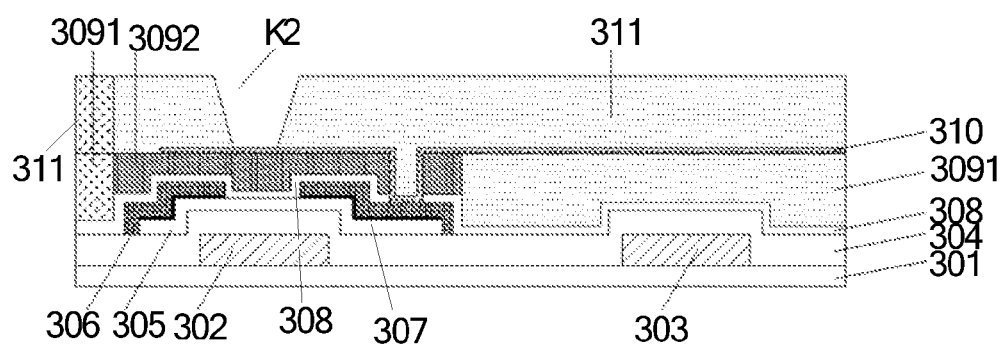

Step S5: forming a second via hole K2 in the second material layer 311 using the photoetching process, as shown in FIG. 9.

Step S6: forming a pixel electrode 312 on the array substrate after step S5 using processes such as chemical vapor deposition, a sputtering process, etc., as shown in FIG. 3.

It shall be noted that the fabricating process described above specifically relates to the exemplary array substrate shown in FIG. 3. As for the fabricating process of the array substrate of any other exemplary embodiment, corresponding adjustments can be made to the fabricating process based on structural changes and the actual conditions.

In a second exemplary embodiment, an array substrate comprises a thin film transistor, a pixel electrode, and an element for providing a common electrode voltage; the array substrate further comprising a first material layer located on the thin film transistor, the first material layer having a first via hole; a first conductive interlayer and a second conductive interlayer located on the first material layer, the first conductive interlayer and the second conductive interlayer being insulated with each other, the first conductive interlayer being electrically connected with the drain of the thin film transistor, and the second conductive interlayer being electrically connected with the element for providing a common electrode voltage; and a second material layer located on the first conductive interlayer and the second conductive interlayer, the second material layer having a second via hole staggered with the first via hole, and the pixel electrode being located on the second material layer; wherein the first conductive interlayer is electrically connected with the pixel electrode through the second via hole, so as to enable the pixel electrode to form a storage capacitance with the second conductive interlayer, or the second conductive interlayer is electrically connected with the pixel electrode through the second via hole, so as to enable the pixel electrode to form a storage capacitance with the first conductive interlayer; and wherein the material of a part of the first material layer located within the opening area of the array substrate and the material of a part of the second material layer located within the opening area are both color photoresists.

In the array substrate, according to the second exemplary embodiment, the original color filter layer is divided into a first material layer and a second material layer. The disconnected first conductive interlayer and second conductive interlayer are formed between the two layers by enabling the first conductive interlayer to be connected with the drain of the thin film transistor. The second conductive interlayer is enabled to be connected with the element for providing a common electrode voltage, such that the distance between the two polar plates of the formed storage capacitance is reduced, which increases the storage capacitance and improves the display stability.

Meanwhile, by dividing the color filter layer into two layers, the via hole formed in the color filter layer is divided, from the original one via hole that directly penetrates the whole color filter layer, into two via holes that penetrate the first material layer or the second material layer. Thus, the depth of the via hole is reduced, such that the shape is better controlled in the via hole forming process, the aperture ratio is reduced, and the pixel opening ratio is increased. Moreover, since the depth of the via hole is reduced, the steep degree of its inner wall is also reduced, such that the pixel electrode and the conductive interlayer that cover the inner wall are not easily broken, which improves the display quality.

Figure 10:
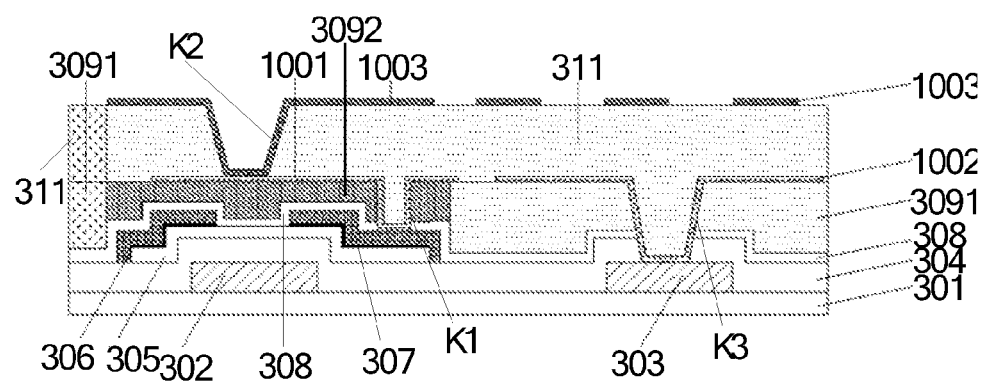
FIG. 10 is a structural view of a first array substrate, according to a second exemplary embodiment.
Figure 11:
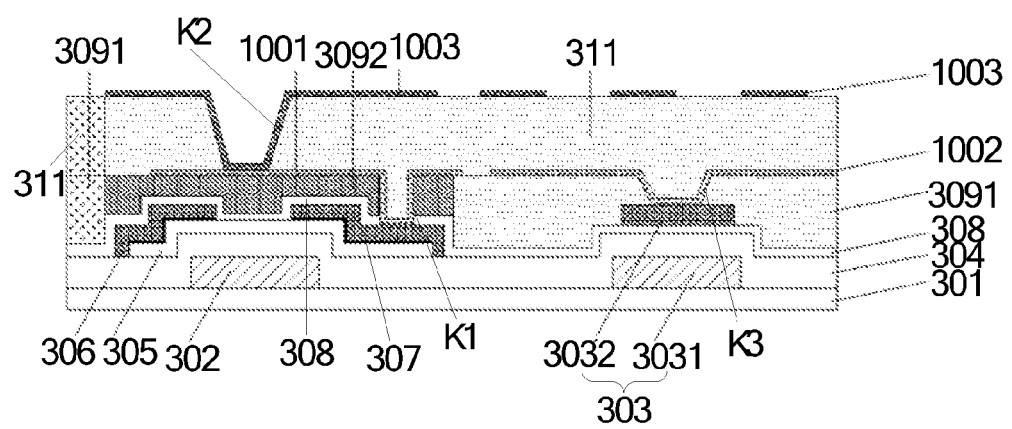
FIG. 11 is a structural view of a second array substrate, according to the second exemplary embodiment.

In the second exemplary embodiment, the storage capacitance is formed by the pixel electrode and the second conductive interlayer, such as for the array substrates shown in FIG. 10 or FIG. 11, wherein, the TFT is a bottom gate structure. However, it will be appreciated that in other exemplary embodiments, the TFT could also be a top gate or side gate structure.

In the second exemplary embodiment, the common electrode 303 serves as an element for providing a common electrode voltage. In other exemplary embodiments, the element for providing a common electrode voltage may also be a peripheral signal line (i.e., a line located in the frame area of the array substrate for connecting the internal line of the array substrate with the external chip) of the array substrate. The element for providing a common electrode voltage may preferably, but not necessarily, be formed in the same layer as the gate 302 of the TFT, so as to simplify the fabricating process of the array substrate. The element for providing a common electrode voltage may also be a structure comprising a first part that is formed in the same layer as the gate 302 of the TFT and a second part that is formed in the same layer as the source 306 and the drain 307 of the TFT, so as to block up the element for providing a common electrode voltage on the basis of simplifying the fabricating process of the array substrate, which is favorable for reducing the depth of a third via hole K3 that is subsequently formed above it. As for the above structure, taking the element for providing a common electrode voltage as a common electrode (e.g., the common electrode 303 shown in FIG. 11), the common electrode 303 may comprise a laminated first part 3031 and second part 3032. In an exemplary embodiment, the second part 3032 is electrically connected with the first part 3031, so as to have a same potential as the first part 3031. Moreover, the gate insulating layer 304 and the insulating layer 308 are also laminated between the first part 3031 and the second part 3032. All of these are favorable for heightening the upper surface of the common electrode 303, thereby reducing the depth of the third via hole K3, enhancing the conductive capability of the second conductive interlayer 1002 that is subsequently carried on the inner wall of the third via hole K3, and further increasing the opening ratio.

The forming material of the first material layer 309, and the setting conditions of its internal light shielding layer 3092 and color filter layer 3091, may be the same as or similar to the first material layer 309 of the first exemplary embodiment. Preferably, but not necessarily, the material of a part of the first material layer that covers the TFT and/or the material of a part of the second material layer 311 that covers the TFT are light shielding materials. Preferably, but not necessarily, the material of a part of the first material layer that covers the common electrode 303 and/or the material of a part of the second material layer 311 that covers the common electrode 303 are light shielding materials.

The depth and setting position of the first via hole K1 may be the same as or similar to the first via hole K1 of the first exemplary embodiment, and the relevant explanation will not be presented to avoid repetition.

The first material layer further has a third via hole K3 for enabling the subsequently formed second conductive interlayer 1002 to be electrically connected with the element (specifically the common electrode 303 in FIG. 10) for providing a common electrode voltage through the third via hole K3. The element for providing a common electrode voltage in the second exemplary embodiment is the common electrode 303. The third via hole K3 can preferably, but not necessarily, be located in a part of the first material layer that corresponds to the common electrode 303. In other exemplary embodiments, if the element for providing a common electrode voltage is a peripheral signal line of the array substrate, the third via hole K3 can preferably, but not necessarily, be located in a part of the first material layer that corresponds to the peripheral signal line, so as to avoid an adverse impact of the third via hole K3 to the pixel opening ratio, and further improve the opening ratio.

As for the depth of the third via hole K3, if the element for providing a common electrode voltage is formed in the same layer as the gate 302 of the TFT, the depth of the third via hole K3 will be greater than the thickness of the first material layer. In such a case, the depth of the third via hole K3 is a sum of the thickness of the first material layer and the thickness of the film between the first material layer and the element for providing a common electrode voltage. If the element for providing a common electrode voltage comprises a first part formed in the same layer as the gate 302 of the TFT, and a second part formed in the same layer as the source 306 and the drain 307 of the TFT, the depth of the third via hole K3 will be less than the thickness of the first material layer, which is more favorable for improving the opening ratio.

The first conductive interlayer 1001 and the second conductive interlayer 1002 between the first material layer 309 and the second material layer 311 can preferably, but not necessarily, be formed in the same layer. In an exemplary embodiment, the forming materials of the two layers are transparent conductive materials. In other exemplary embodiments, the first conductive interlayer 1001 and the second conductive interlayer 1002 can also be formed in different steps and use different forming materials based on actual needs. In the second exemplary embodiment, the first conductive interlayer 1001 has the potential of the drain 307 through the first via hole K1, and the second conductive interlayer 1002 has the potential of the common electrode 303 through the third via hole K3.

The forming material of the second material layer 311, and the setting conditions of its internal light shielding layer 3112 and color filter layer 3111 may be the same as or similar to the second material layer 311 of the first exemplary embodiment.

The second material layer 311 has a second via hole K2, the first conductive interlayer 1001 is electrically connected with the pixel electrode 1003 through the second via hole K2. The second via hole K2 is preferably, but not necessarily, located in a part of the second material layer 311 that corresponds to the TFT, so as to eliminate the impact on the pixel opening ratio. The depth of the second via hole K2 can be the same as or similar to the second via hole K2 of the first exemplary embodiment.

The pixel electrode 1003 may be a whole piece of thin film, or comprise a plurality of strip electrodes side by side (as shown in FIG. 10). When the pixel electrode 1003 comprises a plurality of strip electrodes, it can form a horizontal electric field with the second conductive interlayer 1002 below, so as to constitute a FFS (Fringe Field Switching) structure.

Figure 2:
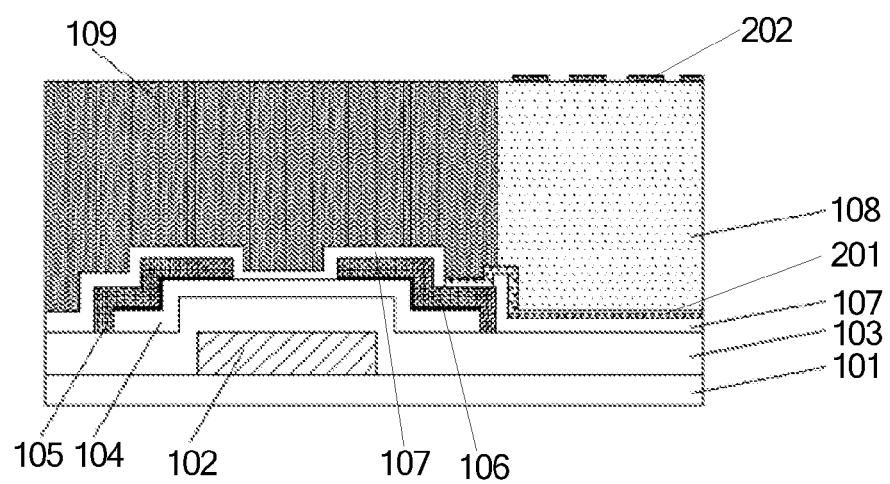
FIG. 2 is a structural view of a conventional FFS type array substrate using the COA technology.

It shall be noted that if a color filter layer is integrated in an array substrate using the conventional FFS technology, its structure may be as shown in FIG. 2. The strip pixel electrode 202 should form a horizontal electric field with the common electrode 201. However, the relatively thick color filter layer 108 reduces the electric field intensity between the two greatly, such that the liquid crystal molecules cannot deflect normally. This causes the COA technology to be ill suited for direct application in the FFS type array substrate directly. In the array substrate, according to the second exemplary embodiment, the second conductive interlayer 1002 forms a horizontal electric field with the strip pixel electrode 1003, and the thickness of the color photoresist between the two is reduced. Therefore, the intensity of the horizontal electric field will not be weakened seriously. Instead, the requirement for normal deflection of the liquid crystal molecules can be met satisfactorily, such that the array substrate provided by the second exemplary embodiment can use the FFS type structure directly.

Figure 12:
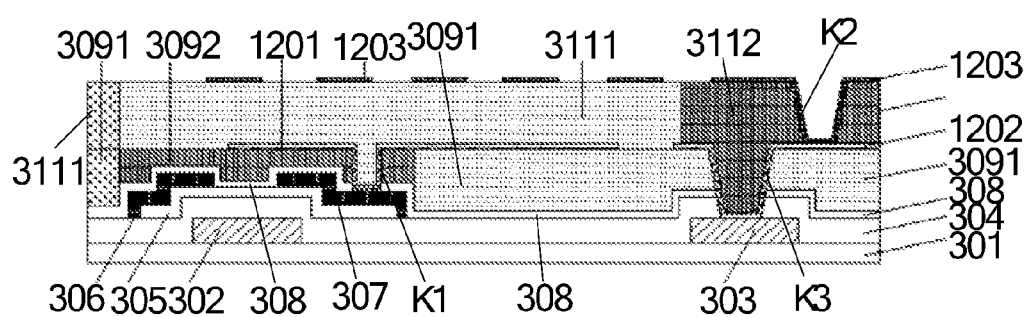
FIG. 12 is a structural view of a third array substrate, according to the second exemplary embodiment.

In a exemplary embodiment, wherein the storage capacitance is formed by the pixel electrode and the first conductive interlayer, the specific structure of the array substrate provided by the second exemplary embodiment is shown in FIG. 12. As shown in FIG. 12, the first conductive interlayer 1201 is connected with the drain 307 of the TFT through the first via hole K1, thereby having the potential of the drain 307. However, the first conductive interlayer 1201 is not connected with the pixel electrode 1203. The second conductive interlayer 1202 is connected with the common electrode 303 through the third via hole K3, thereby having the potential of the common electrode 303. Meanwhile, the second conductive interlayer 1202 is also connected with the pixel electrode 1203 through the second via hole K2, thereby enabling the pixel electrode 1203 to have the voltage of the common electrode. Since the potentials of the first conductive interlayer 1201 and the pixel electrode 1203 are different, the first conductive interlayer 1201 can be taken as a polar plate, and the pixel electrode 1203 can be taken as another polar plate, thereby forming a storage capacitance.

In the above array substrate, according to the second exemplary embodiment, the element for providing a common electrode potential is the common electrode 303. However, in other exemplary embodiments, the element for providing a common electrode potential may also be a peripheral signal line of the array substrate. In such a case, the third via hole K3 can preferably, but not necessarily, be arranged in an area of the first material layer that corresponds to the peripheral signal line of the array substrate, so as to avoid impact of the via hole on the pixel opening ratio.

Since the second conductive interlayer 1202 is electrically connected with the pixel electrode 1203 through the second via hole K2, the second via hole K2 is preferably located in a part of the second material layer that corresponds to the common electrode 303.

In order to shield the second via hole K2, the third via hole K3, and the common electrode 303, the corresponding parts of the first material layer and/or the second material layer that cover the three can preferably, but not necessarily, be formed by light shielding materials. For example, as shown in FIG. 12, the second material layer may comprise a second color filter layer 3111 that is located in the opening area and a second light shielding layer 3112 that covers the common electrode 303. The second via hole K2 is preferably, but not necessarily, formed in the second light shielding layer 3112, so as to avoid impact on the opening ratio.

The pixel electrode 1203 may be a whole piece of film, and may also be a film comprising a plurality of strip electrodes positioned side by side (i.e., adjacent to one another). When the pixel electrode 1203 comprises a plurality of strip electrodes positioned side by side, the array substrate is an FFS type array substrate. The two electrodes that form a horizontal electric field in the FFS type array substrate are the pixel electrode 1203 and the first conductive interlayer 1201, with the distance between the two only being the thickness of the second material layer. This thickness is greatly reduced compared with the distance between the two polar plates of the storage capacitance in the prior art, such that the intensity of the horizontal electric field formed therein will not be weakened greatly. Consequently, the array substrate using the COA technology, according to the second exemplary embodiment, can be applied in the FFS structure directly.

The second exemplary embodiment divides the color filter layer into two layers for preparation and inserts therein a first conductive interlayer and a second conductive interlayer that are spaced, such that the first conductive interlayer has a potential of the pixel electrode, the second conductive interlayer has a potential of the common electrode. This reduces the distance between the two polar plates of the finally formed storage capacitance greatly, thereby increasing the storage capacitance and improving the display stability.

Furthermore, by forming a double layer of via holes, the depth of the via holes are reduced, such that the aperture ratio of the via hole is reduced and the opening ratio is increased. Additionally, the via hole with a relatively small depth reduces the difficulty of the preparation process, and poor surface shape is reduced, thereby improving the display quality.

Furthermore, by using the structure of a double layer color filter layer sandwiched with a first conductive interlayer and a second conductive interlayer therebetween, the distance between the pixel electrode and the common electrode is shortened, and the intensity of the electric field formed between the two is relatively strong. Therefore, the FFS technology can be applied in the array substrate integrated with a color filter layer directly.

It shall be noted that the fabricating process of the array substrate according to the second exemplary embodiment can be based on its specific structure, and can be the same as or similar to the fabricating process of the array substrate according to the first exemplary embodiment.

In a third exemplary embodiment, a display device comprises an array substrate according to first exemplary embodiment or the second exemplary embodiment. The display device may be any product or component with a display function, such as a liquid crystal panel, an electronic paper, an OLED panel, a liquid crystal television, a liquid crystal display, a digital photo frame, a mobile phone, a tablet computer, and the like. Based on the advantages of the array substrate according to first and second exemplary embodiments, the display device according to the third exemplary embodiment can have the advantages of high stability of picture display, large pixel opening ratio, high display quality, etc. relative to the conventional display device. Moreover, the display device provided by the third exemplary embodiment may be an FFS type structure.

Although the present disclosure has been described with reference to specific embodiments, it should be understood that the limitations of the described embodiments are provided merely for purpose of illustration and are not intended to limit the present invention and associated general inventive concepts. Instead, the scope of the present invention is defined by the appended claims, and all variations and equivalents that fall within the range of the claims are intended to be embraced therein. Thus, other embodiments than the specific exemplary ones described herein are equally possible within the scope of these appended claims.

The invention claimed is:

1. An array substrate comprising a thin film transistor, a pixel electrode, and a common electrode, wherein the array substrate further comprises:
    a first material layer located on the thin film transistor, the first material layer having a first via hole;
    a conductive interlayer located on the first material layer, the conductive interlayer being electrically connected with the drain of the thin film transistor through the first via hole; and
    a second material layer located on the conductive interlayer, the second material layer having a second via hole staggered with the first via hole;
    wherein the pixel electrode is located on the second material layer;
    wherein the conductive interlayer is electrically connected with the pixel electrode through the second via hole, so as to form a storage capacitance with the common electrode;
    wherein the material of a part of the first material layer located within a pixel opening area of the array substrate is photoresist;
    wherein the material of a part of the second material layer located within the pixel opening area of the array substrate is photoresist;
    wherein the material of the conductive interlayer is a transparent conductive material; and
    wherein the second via hole is located in a part of the second material layer that corresponds to the thin film transistor or the second via hole is located in a part of the second material layer that corresponds to the common electrode.

2. The array substrate of claim 1, wherein at least one of a part of the first material layer that covers the thin film transistor and a part of the second material layer that covers the thin film transistor is a light shielding material.

3. The array substrate of claim 1, wherein at least one of a part of the first material layer that covers the common electrode and a part of the second material layer that covers the common electrode is a light shielding material.

4. A display device comprising the array substrate according to claim 1.

5. An array substrate comprising a thin film transistor, a pixel electrode, and an element for providing a common electrode voltage, wherein the array substrate further comprises:
    a first material layer located on the thin film transistor, the first material layer having a first via hole;
    a first conductive interlayer and a second conductive interlayer located on the first material layer, the first conductive interlayer and the second conductive interlayer being insulated from each other, the first conductive interlayer being electrically connected with a drain of the thin film transistor through the first via hole, and the second conductive interlayer being electrically connected with the element for providing a common electrode voltage; and
    a second material layer located on the first conductive interlayer and the second conductive interlayer, the second material layer having a second via hole staggered with the first via hole;
    wherein the pixel electrode is located on the second material layer;
    wherein the first conductive interlayer is electrically connected with the pixel electrode through the second via hole, so as to enable the pixel electrode to form a storage capacitance with the second conductive interlayer, or the second conductive interlayer is electrically connected with the pixel electrode through the second via hole, so as to enable the pixel electrode to form a storage capacitance with the first conductive interlayer;
    wherein the material of a part of the first material layer located within a pixel opening area of the array substrate is photoresist;
    wherein the material of a part of the second material layer located within the pixel opening area of the array substrate is photoresist;
    wherein the pixel electrode is a single thin film or the pixel electrode comprises a plurality of adjacent strip electrodes;
    wherein the first material layer further has a third via hole; and
    wherein the second conductive interlayer is electrically connected with the element for providing a common electrode voltage through the third via hole.

6. The array substrate of claim 5, wherein the element for providing a common electrode voltage is a common electrode; and
    wherein the third via hole is located in a part of the first material layer that corresponds to the common electrode.

7. The array substrate of claim 6, wherein the second via hole is located in a part of the second material layer that corresponds to the common electrode, when the second conductive interlayer is electrically connected with the pixel electrode through the second via hole.

8. The array substrate of claim 7, wherein at least one of a part of the first material layer that covers the common electrode and a part of the second material layer that covers the common electrode is a light shielding material.

9. The array substrate of claim 5, wherein the element for providing a common electrode voltage is a peripheral signal line of the array substrate; and
    wherein the third via hole is located in a part of the first material layer that corresponds to the peripheral signal line.

10. The array substrate of claim 5, wherein the element for providing a common electrode voltage is formed in the same layer as the gate of the thin film transistor; and
    wherein the depth of the third via hole is greater than the thickness of the first material layer.

11. The array substrate of claim 5, wherein the element for providing a common electrode voltage comprises a first part formed in the same layer as the gate of the thin film transistor, and a second part formed in the same layer as the source and the drain of the thin film transistor; and
    wherein the depth of the third via hole is less than the thickness of the first material layer.

12. The array substrate of claim 5, wherein the materials of the first conductive interlayer and the second conductive interlayer are transparent conductive materials.

13. The array substrate of claim 5, wherein the second via hole is located in a part of the second material layer that corresponds to the thin film transistor, when the first conductive interlayer is electrically connected with the pixel electrode through the second via hole.

14. The array substrate of claim 13, wherein at least one of a part of the first material layer that covers the thin film transistor and a part of the second material layer that covers the thin film transistor is a light shielding material.

15. A display device comprising the array substrate according to claim 5.

* * * * *